(12) United States Patent
Jaffe

(10) Patent No.: US 7,834,937 B2
(45) Date of Patent: *Nov. 16, 2010

(54) DIGITAL IF DEMODULATOR

(75) Inventor: Steven T. Jaffe, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/076,849

(22) Filed: Mar. 24, 2008

(65) Prior Publication Data
US 2008/0180578 A1    Jul. 31, 2008

Related U.S. Application Data

(63) Continuation of application No. 10/776,991, filed on Feb. 12, 2004, now Pat. No. 7,352,411, which is a continuation-in-part of application No. 10/448,062, filed on May 30, 2003, now Pat. No. 7,239,357, and a continuation-in-part of application No. 09/739,349, filed on Dec. 15, 2000, now Pat. No. 7,106,388.

(60) Provisional application No. 60/401,043, filed on Aug. 6, 2002.

(51) Int. Cl.
*H04N 5/455* (2006.01)

(52) U.S. Cl. .................. 348/726; 348/725; 348/731; 348/736; 348/E5.113

(58) Field of Classification Search ......... 348/725–726, 348/731–733, 735–736, 614–618; 375/324, 375/326–327, 235, 340, 344–346, 350; 455/205–209, 455/214, 221; *H04N 5/455*
See application file for complete search history.

(56) References Cited

U.S. PATENT DOCUMENTS

| 4,502,078 A | 2/1985 | Steckler et al. |
| 4,623,926 A | 11/1986 | Sakamoto |
| 5,031,233 A | 7/1991 | Ragan |
| 5,570,137 A | 10/1996 | Goeckler |

(Continued)

OTHER PUBLICATIONS

Poole, S., Surface, G., Singh, B., Dyer, N., "A CMOS Subscriber Line Audio Processing Circuit Including Adaptive Balance," IEEE International Symposium on Circuits and Systems, Finland, Espoo, vol. 2 of 3, Jun. 7-9, 1988, pp. 1931-1934.

*Primary Examiner*—Trang U Tran
(74) *Attorney, Agent, or Firm*—Sterne, Kessler, Goldstein & Fox P.L.L.C.

(57) ABSTRACT

A digital IF demodulator includes an analog-to-digital (A/D) converter that receives an analog IF signal and converts it to a digital IF signal. A parallel multiplier then down-converts the digital IF signal to a baseband signal having a video component and an audio component. The frequency down-conversion uses a parallel multiplier driven by an outer feedback loop that corrects gross frequency errors in said digital IF signal. The digital IF demodulator also includes a video recovery circuit that selects the video component from the baseband signal and further down-converts the baseband signal to a video baseband using a video complex mixer driven by an inner feedback loop that corrects fast phase perturbations in the video recovery circuit. Finally, the digital IF demodulator includes an audio recovery circuit that (i) receives said baseband signal from the parallel multiplier, and (ii) down-converts the audio component to an audio baseband signal using an audio complex mixer.

18 Claims, 8 Drawing Sheets

U.S. PATENT DOCUMENTS

| | | | |
|---|---|---|---|
| 5,715,012 A | 2/1998 | Patel et al. | |
| 5,737,035 A | 4/1998 | Rotzoll | |
| 5,847,612 A | 12/1998 | Birleson | |
| 5,905,405 A | 5/1999 | Ishizawa | |
| 5,987,078 A * | 11/1999 | Kiyanagi et al. | 375/344 |
| 6,005,640 A | 12/1999 | Strolle et al. | |
| 6,115,432 A | 9/2000 | Mishima et al. | |
| 6,133,964 A * | 10/2000 | Han | 348/726 |
| 6,147,713 A | 11/2000 | Robbins et al. | |
| 6,151,367 A * | 11/2000 | Lim | 375/326 |
| 6,163,684 A | 12/2000 | Birleson | |
| 6,177,964 B1 | 1/2001 | Birleson et al. | |
| 6,233,295 B1 | 5/2001 | Wang | |
| 6,363,126 B1 | 3/2002 | Furukawa et al. | |
| 6,445,726 B1 | 9/2002 | Gharpurey | |
| 6,476,878 B1 | 11/2002 | Lafay et al. | |
| 6,542,203 B1 | 4/2003 | Shadwell et al. | |
| 6,545,728 B1 | 4/2003 | Patel et al. | |
| 6,559,898 B1 | 5/2003 | Citta et al. | |
| 6,738,098 B1 | 5/2004 | Hutchinson | |
| 6,868,131 B2 | 3/2005 | Ohishi | |
| 7,106,388 B2 | 9/2006 | Vorenkamp et al. | |
| 7,239,357 B2 | 7/2007 | Jaffe | |
| 7,352,411 B2 * | 4/2008 | Jaffe | 348/726 |

\* cited by examiner

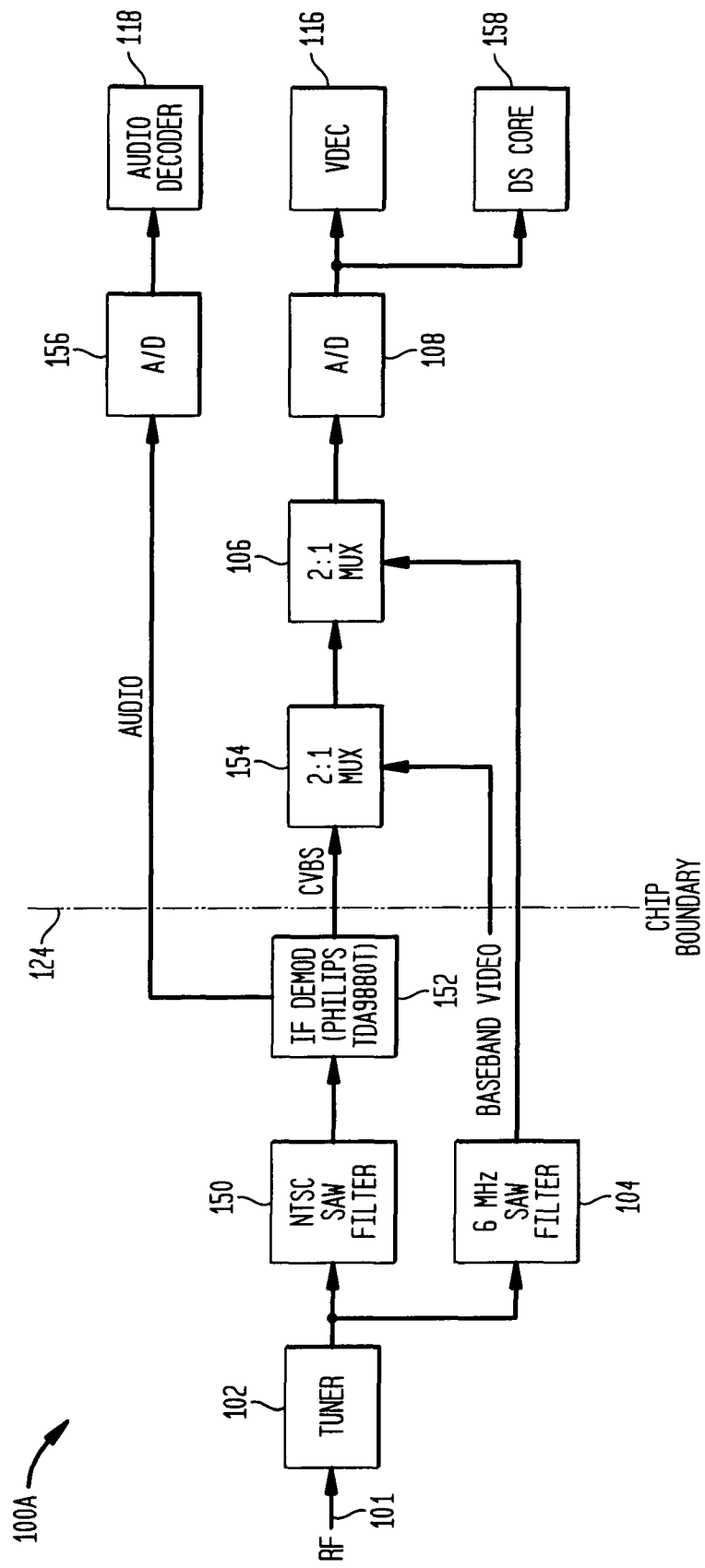
FIG. 1A
(CONVENTIONAL)

DIGITAL IF DEMODULATOR

CROSS-REFERENCE TO RELATED APPLICATIONS

This application is a Continuation of U.S. patent application Ser. No. 10/776,991, filed Feb. 12, 2004, which is a Continuation-In-Part of application Ser. No. 10/448,062, filed May 30, 2003, which claims the benefit of U.S. Provisional Patent Application 60/401,043, filed on Aug. 6, 2002, and application Ser. No. 10/448,062 is a Continuation-In-Part of application Ser. No. 09/739,349, filed Dec. 15, 2000, all of which are incorporated by reference herein in their entirety.

BACKGROUND OF THE INVENTION

1. Field of the Invention

The present invention is related to a digital IF demodulator, and more specifically to a digital IF demodulator for processing television signals.

2. Background Art

Various analog IF demodulators are used to process television signals. These analog approaches require very accurate filter implementations that often require expensive and time consuming tuning of individual units. To properly recover the video, the shape of the Nyquist filter in the receiver needs to be controlled accurately, and the tuner needs to accurately center the picture carrier exactly in the middle of the Nyquist slope of the IF filter, which requires high precision phase lock loops in the tuner. Further, separate preprocessing filters for analog television signals and digital television signals are currently required if the same IF circuitry is to be used for the demodulation of both of these signals.

It is desirable to integrate the IF demodulator onto a single low cost silicon substrate fabricated with the low cost Complementary Metal Oxide Semiconductor (CMOS) process. Such integration reduces part count, cost, and size. Complete integration into a single, low cost substrate has been difficult to achieve because the limitations of the integrated circuitry often call for external components. Such external circuitry typically requires components having large values of capacitance and inductance that do not facilitate integration into a single substrate.

Thus, what is needed is a digital IF demodulator that may be completely integrated onto a single silicon substrate. Such a demodulator could reduce or eliminate external circuitry, and allow efficient and economical integration and fabrication on a single silicon substrate.

BRIEF SUMMARY OF THE INVENTION

The present invention includes a digital IF demodulator that receives and demodulates an analog IF input signal to produce a digital audio signal and a digital video signal. Herein, the term 'digital video signal' refers to a digitized version of an analog video signal, and the term 'digital audio signal' refers to a digitized version of the analog audio signal. In embodiments, the analog IF input signal is a television signal or channel that has been down-converted to IF from RF. The digital IF demodulator includes an analog-to-digital (A/D) converter that receives an analog IF signal and converts it to a digital IF signal. A quadrature multiplier then down-converts the digital IF signal to a baseband signal having a video component and an audio component. The quadrature multiplier is driven by an outer feedback loop that corrects gross frequency errors in said digital IF signal. The digital IF demodulator also includes a video recovery circuit and an audio recovery circuit. The video recovery circuit selects the video component from the baseband signal and further down-converts the baseband signal to a video baseband using a complex mixer driven by an inner feedback loop that corrects for fast phase perturbations in the video signal. The audio recovery circuit receives the baseband signal from the quadrature multiplier, down-converts and demodulates the audio component to an audio baseband signal. The audio recovery circuit is driven by input from the video recovery circuit.

The present invention also includes a method of demodulating an analog IF signal having a video component and an audio component. The method includes digitizing the analog IF signal to create a digital IF signal having a video component and an audio component. An outer loop oscillator signal is generated that has an in-phase component and a quadrature component. The digital IF signal is then down-converted to baseband using a quadrature multiplier driven by the outer loop oscillator signal. The outer loop oscillator signal corrects gross frequency errors in the digital IF signal. The down-converted digital IF signal, which has both video and audio components, is then supplied to both video and audio recovery circuits. At the video recovery circuit, the baseband signal is then filtered and decimated. An inner loop oscillator signal is generated that has an in-phase component and a quadrature component. The digital IF signal is then further down-converted to a video baseband signal using a complex mixer driven by the inner loop oscillator signal. The inner loop oscillator corrects fast phase perturbations in the digital IF signal. A digital video output is recovered from the video baseband signal. The down-converted baseband signal is also supplied to the audio recovery circuit, where it is down-converted and demodulated to an audio baseband. The audio recovery circuit is driven by input from the video recovery circuit. A digital audio output is recovered from the audio baseband signal.

BRIEF DESCRIPTION OF THE DRAWINGS/FIGURES

The present invention is described with reference to the accompanying drawings. In the drawings, like reference numbers indicate identical or functionally similar elements. Additionally, the left-most digit of a reference number identifies the drawing in which the reference number first appears.

FIG. 1A illustrates a conventional television receiver having an RF tuner, a National Television Standards Committee (NTSC) Surface Acoustic Wave (SAW) Filter, an IF SAW filter, an analog IF demodulator, two Analog-to-Digital Converters, a audio decoder a Video Decoder (VDEC) and a Digital Signal Processing Core.

Figure 2A:
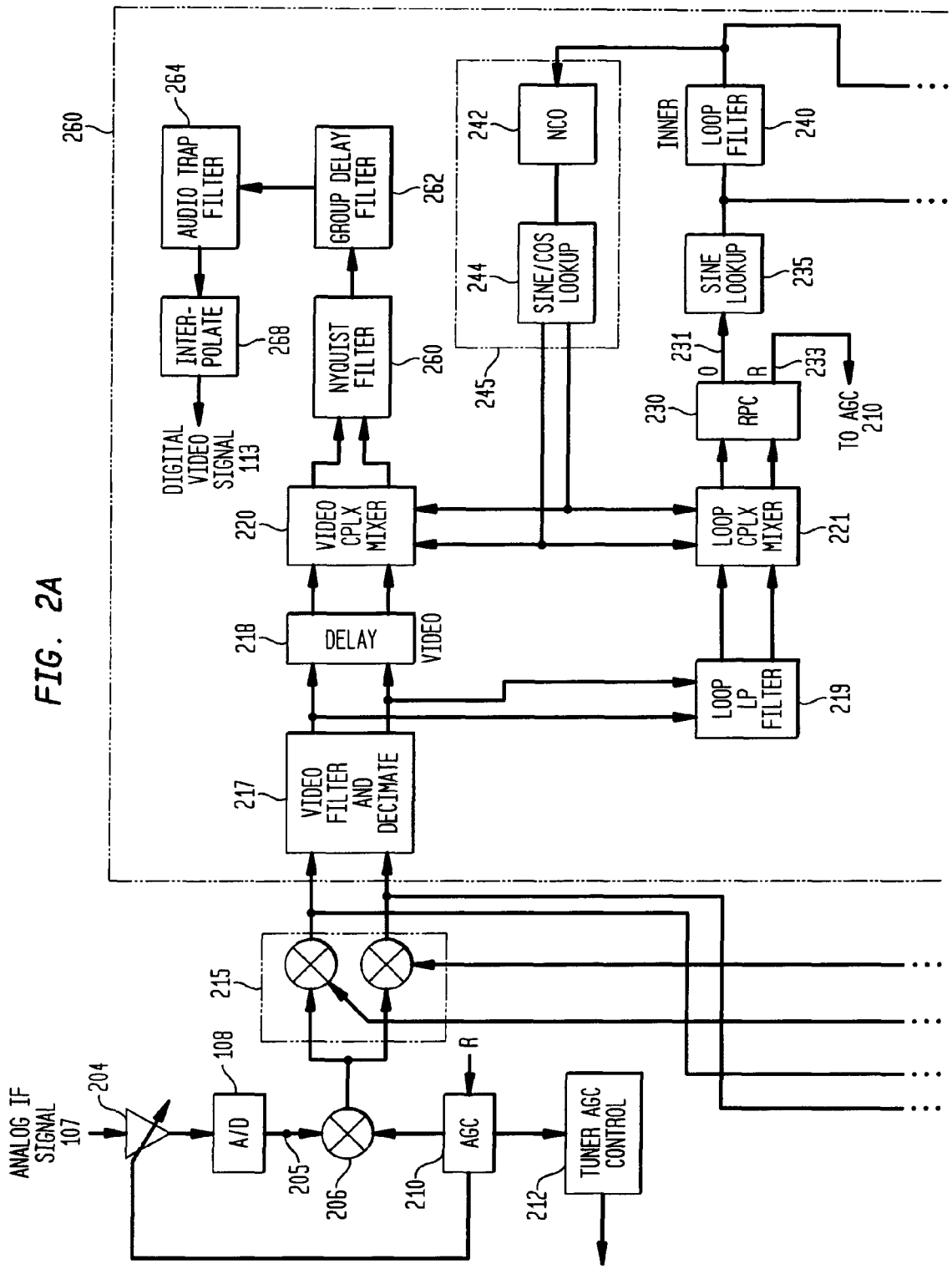
Figure 2B:
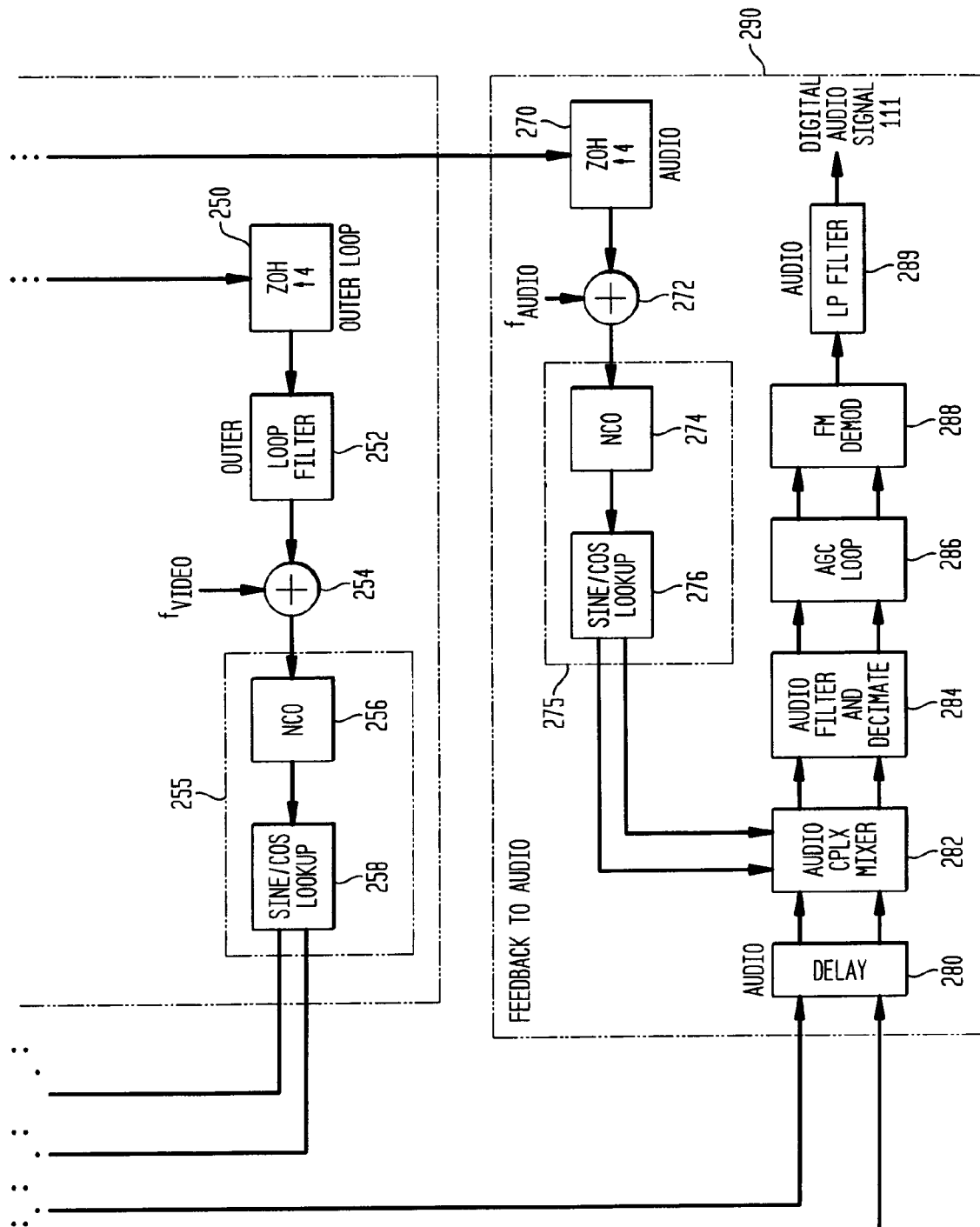

FIGS. 2A and 2B further illustrate the digital IF demodulator according to embodiments of the present invention.

Figure 3:
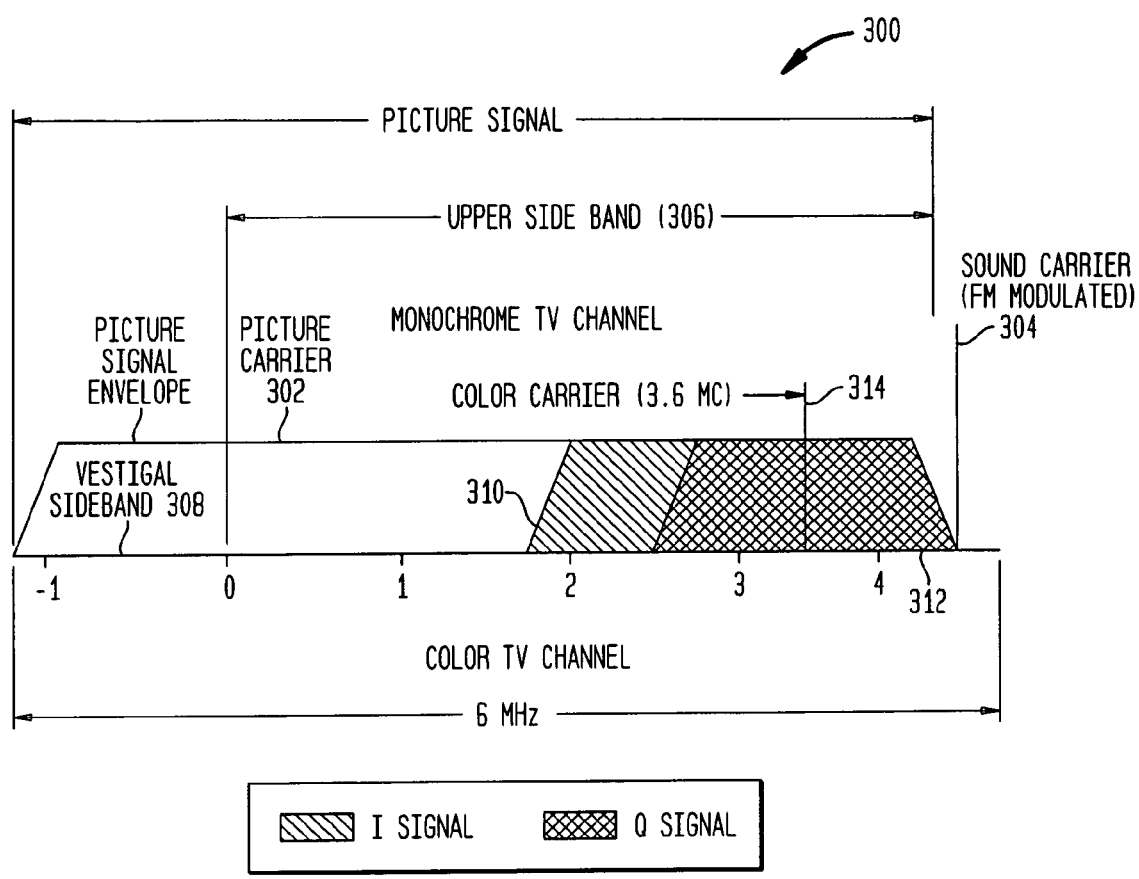

FIG. 3 illustrates the frequency spectrum of a TV channel with the picture carrier at 0 Hz (DC), and the sound carrier frequency shifted off DC by 4.5 MHz.

Figure 4A:
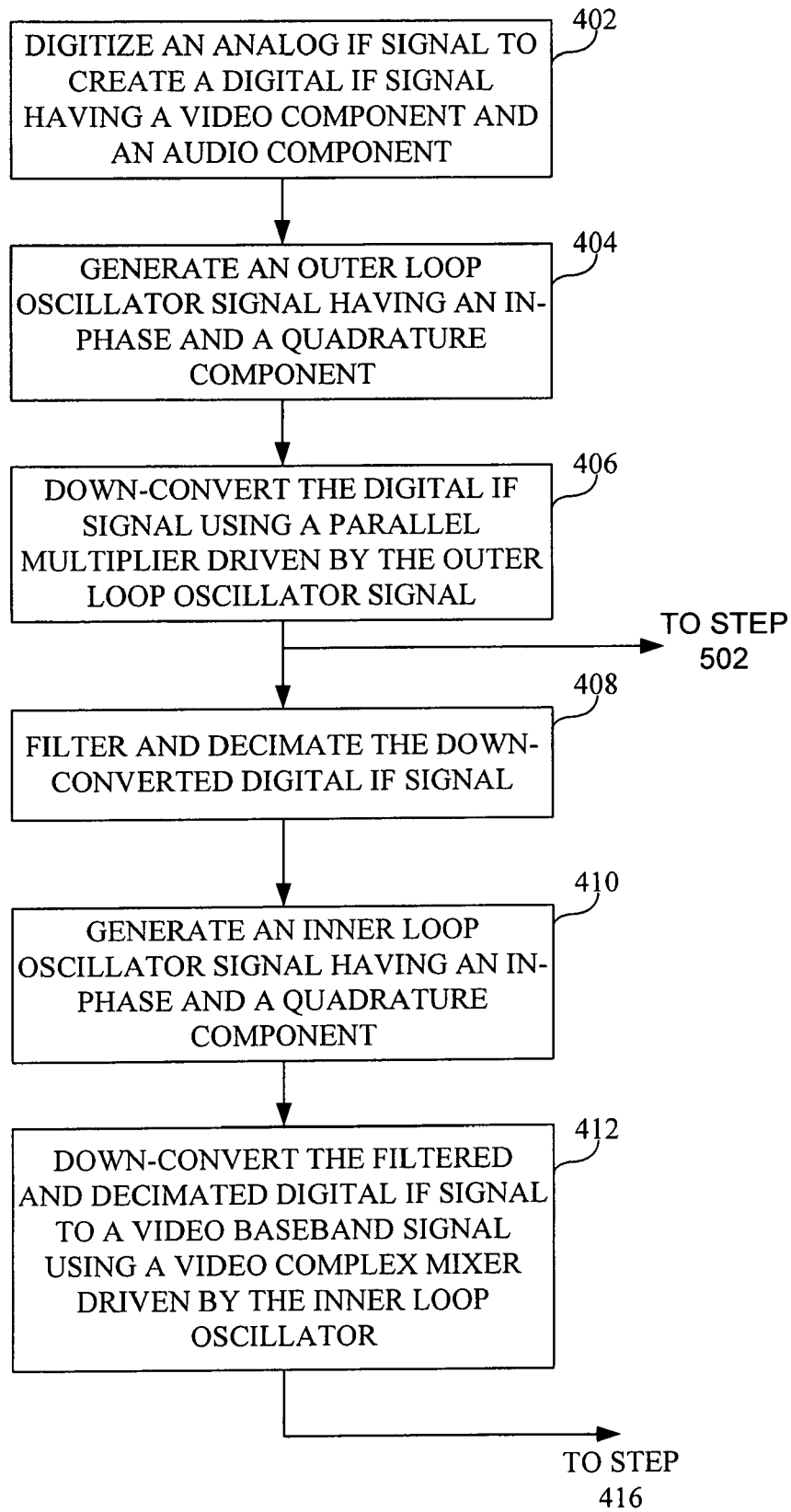
Figure 4B:
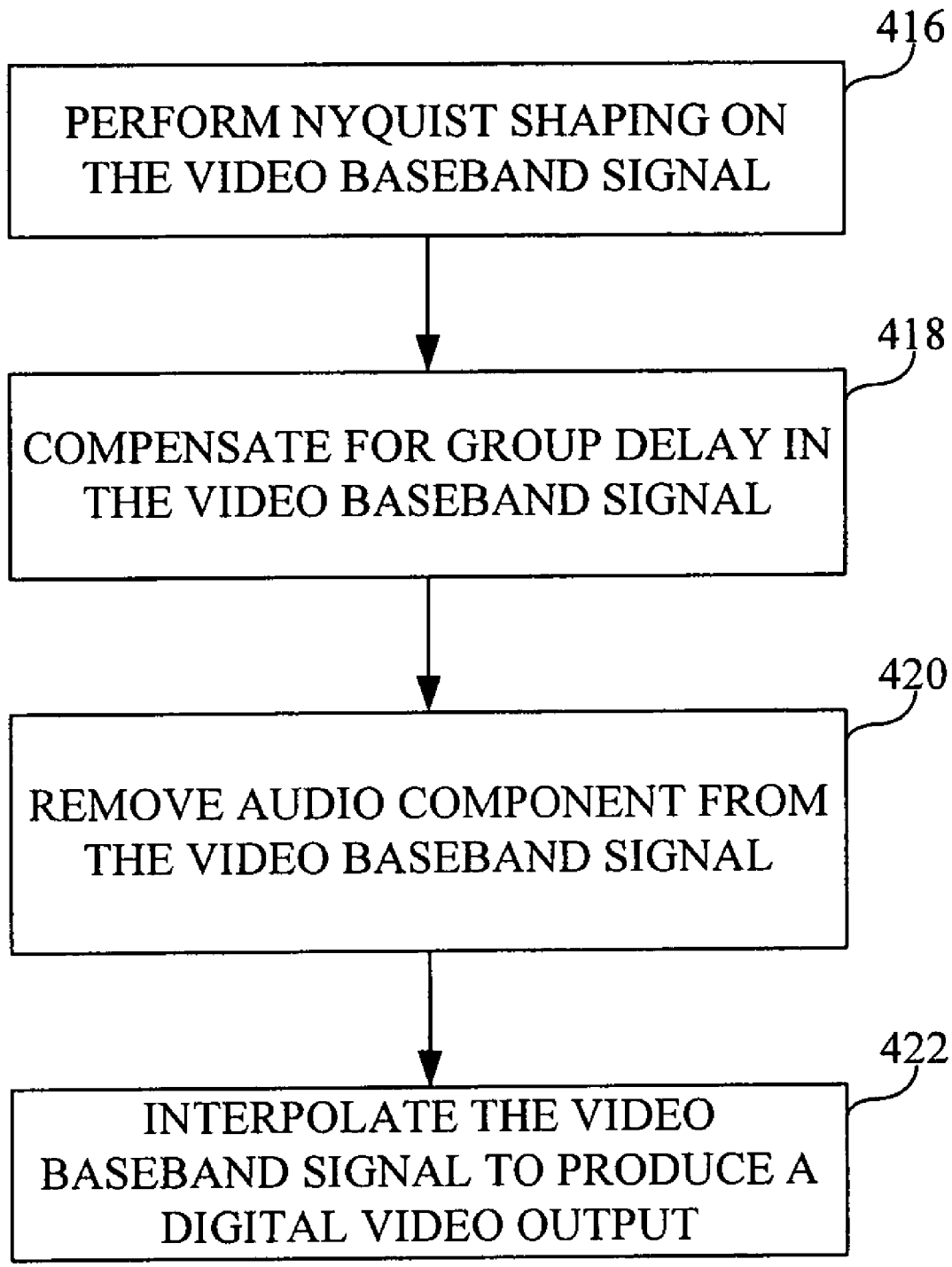

FIGS. 4A and 4B illustrate a method for recovering a digital video signal from the analog IF signal.

Figure 5:
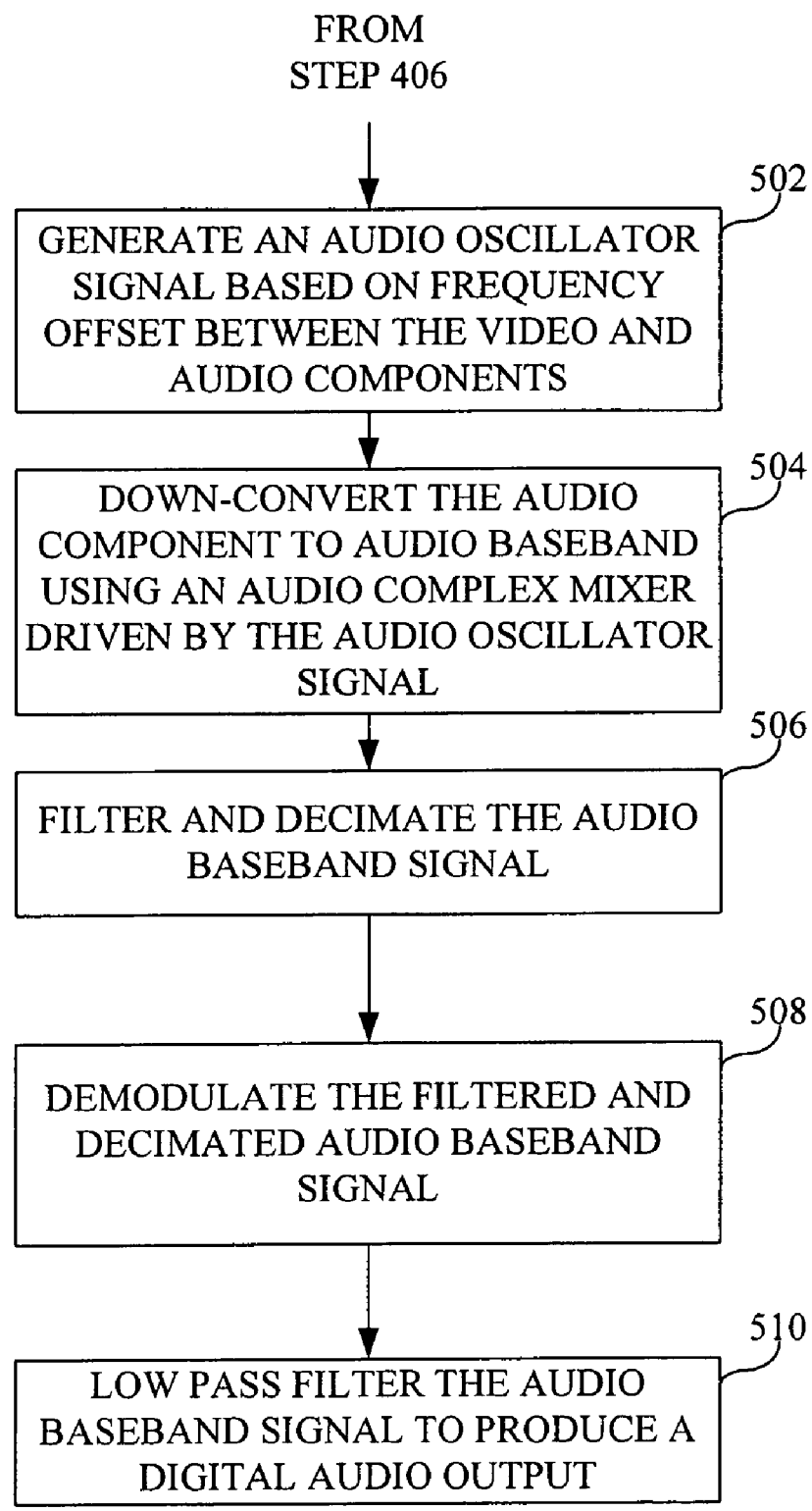

FIG. 5 illustrates a method for recovering a digital audio signal from the analog IF signal.

DETAILED DESCRIPTION OF THE INVENTION

FIG. 1A illustrates a conventional television receiver 100A including an RF tuner 102, a surface acoustic wave (SAW)

filter 150, an IF SAW filter 104, an analog IF demodulator 152, two analog-to-digital (A/D) converters 108, 156, a audio decoder 118, a Video Decoder (VDEC) 116, and a digital signal processing core 158. Multiple SAW filters 104, 150 are needed to pre-process the plurality of signals that exist in today's television signals. For example, in North America, a National Television Standards Committee (NTSC) signal requires a NTSC SAW filter 150 to pre-process the NTSC signal, and also requires an analog NTSC IF demodulator 152. A 6 MHz SAW 104 is typically used to pre-process a signal containing digital video (i.e., a QAM signal). Other types of signals, each of which may require a different SAW filter, include Phase Alternation Line (PAL) or Systeme Electronique Couleur Avec Memoir (SECAM), In order to process both the analog video and analog audio simultaneously, separate A/D converters are required for each. The analog video and digital TV signals can be processed with the same A/D converter. After the signals are digitized, the audio signal is decoded by the audio decoder 118 and the video signal is decoded by the VDEC 116. The digital TV signal is processed in the digital QAM demodulator 158.

Figure 1B:
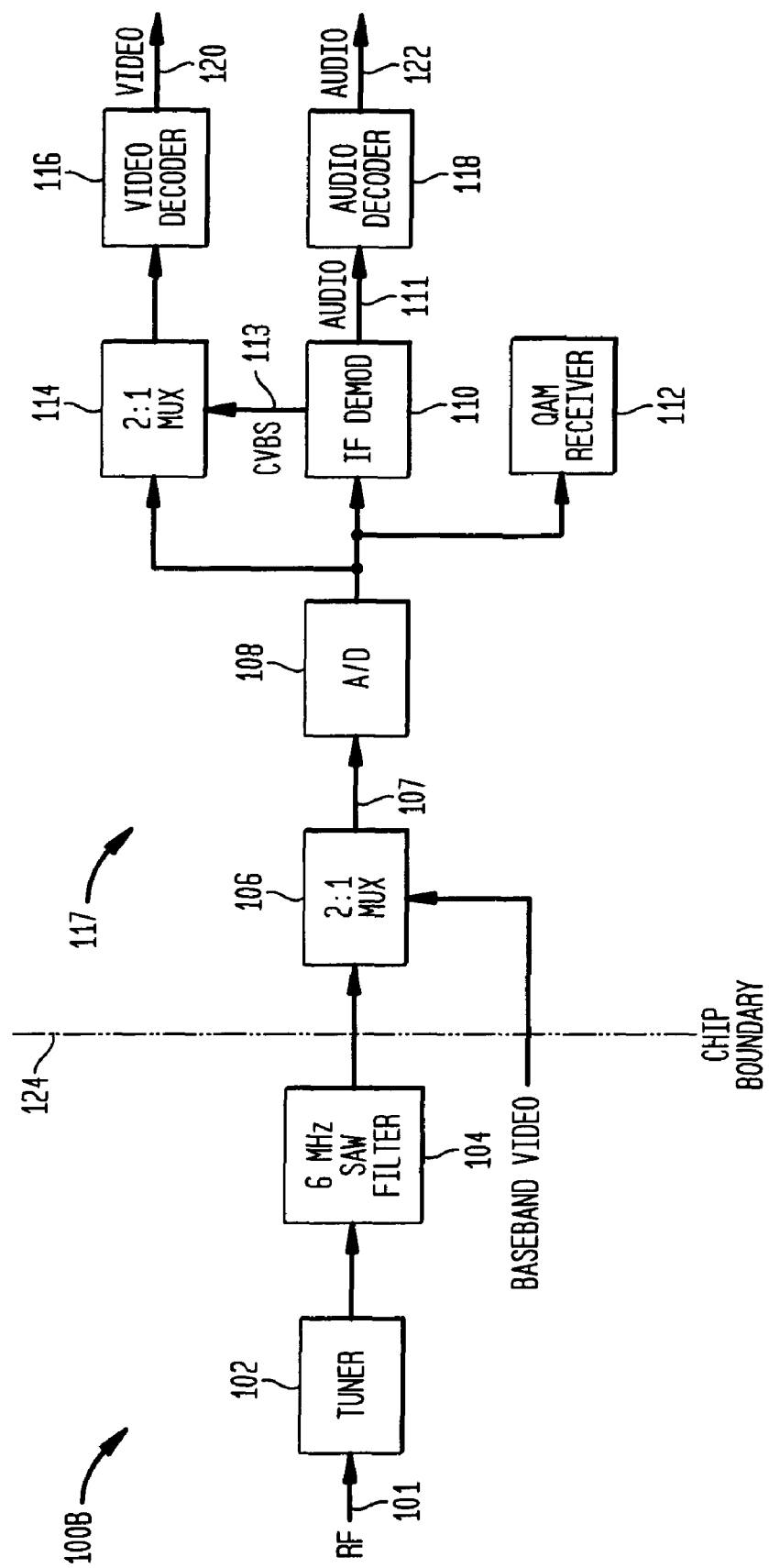
FIG. 1B illustrates a television receiver having an RF tuner, an IF SAW filter, and a digital IF demodulator.

FIG. 1B illustrates a television receiver 100B implementing the present invention. Receiver 100B includes an RF tuner 102, an IF filter 104 (e.g. SAW filter), and a IF processor/demodulator 117. The IF processor 117 can be configured on a single semiconductor substrate, as indicated by the chip boundary line 124. The tuner 102 receives an RF input signal 101 having a plurality of channels, for example, TV channels that are spaced 6 MHz apart. The RF tuner 102 selects and down-converts a desired channel to an IF signal that is output from the tuner 102. For example, the IF signal can be at a frequency of 36 MHz, 44 MHz, or some other IF frequency. The SAW filter 104 receives the IF signal from the tuner 104 and filters the IF signal to remove any remaining unwanted channels. The tuner 102 can be implemented on a single substrate, as further described in "Digital IF Demodulator For Video Applications," application Ser. No. 09/739,349, filed on Dec. 15, 2000, which is incorporated herein by reference.

The IF processor 117 receives the IF signal from the SAW filter 104, and demodulates the IF signal, to produce a digital video signal 120 and a digital audio signal 122, that carry, for example, TV programming or other information. The IF processor 117 includes a 2:1 multiplexer, an A/D converter 108, an IF demodulator 110, a QAM receiver 112, a 2:1 multiplexer 114, a video decoder 116, and an audio decoder 118. As indicated from the chip boundary 124, the IF processor 117 can be configured on a single substrate, such as for example a CMOS substrate.

The 2:1 multiplexer 106 in the IF processor 117 multiplexes the IF signal from the SAW filter 104 with any baseband video signal that may be present to produce an analog signal 107 that is sent to the A/D converter 108. The A/D converter 108 digitizes the output of the 2:1 multiplexer 106. The IF demodulator 110 receives the digitized output from the A/D converter 108, and down-converts the A/D converter 108 output to produce a digital video signal 113 and a digital audio signal 111. The digital audio signal 111 can be a BTSC compatible digital audio signal, and the digital video signal 113 can be a composite video broadcasting signal (CVBS). The audio decoder 118 receives the digital audio output 111 from the IF demodulator 110 and generates decoded audio output 122. The 2:1 multiplexer 114 receives the digital video output 113 from the IF demodulator 110 and multiplexes it with the output from the A/D converter 108. A video decoder 116 decodes the output of the 2:1 multiplexer to produce the video signal 120.

The IF processor 117 can also include a QAM receiver 112 to process an output of the A/D converter 108 that includes QAM data. In embodiments, the IF demodulator 110 and the QAM receiver 112 use common circuit elements.

IF demodulator 110 processes both an NTSC analog video signal (or a PAL signal or a SECAM signal), along with a digital television signal (e.g., a QAM television signal). Such flexibility simplifies the front end receiver requirements by unifying the signal path prior to the demodulator 110, thus reducing both cost and part count. The present invention thus eliminates the need for a separate analog video (i.e., NTSC) SAW filter 150 (FIG. 1A), the analog video (i.e., NTSC) IF demodulator 152, and the additional A/D converter 156 that are shown in FIG. 1A. The signal path before the chip boundary 124 is unified, thus simplifying the tuner output and filtering requirements.

FIGS. 2A and 2B further illustrate the IF demodulator 110 that receives the analog IF input signal 107 and generates a digital audio signal 111 and a digital video signal 113 that is ready for baseband decoding by the decoders 116 and 118. At the front end, the IF demodulator 110 includes a programmable gain amplifier (PGA) 204, the A/D converter 108, an AGC circuit 210, a tuner interface 212, and a quadrature multiplier 215. The IF demodulator 110 further includes a video recovery circuit 260 and an audio recovery circuit 290. Note that the A/D converter 108 can be implemented internal or external to the IF demodulator 110. In other words, the A/D converter can be on the same chip level as the IF demodulator 110.

The video recovery circuit 260 of the IF demodulator 110 includes a video filter and decimator block 217, a video delay block 218, a video complex mixer 220, a Nyquist filter 260, a group delay filter 262, an audio trap filter 264, and an interpolator 268. The video recovery circuit 260 also includes an outer feedback loop and an inner feedback loop. As explained in more detail below, the outer feedback loop tracks and corrects gross frequency errors, while the inner loop tracks and corrects fast phase perturbations.

The outer feedback loop includes a loop low pass filter 219 that taps the output of the video filter and decimator block 217, a loop complex mixer 221, a rectangular-to-polar converter (RPC) 230, a sine look up table 235, an outer loop zero-order-hold circuit 250, an outer loop filter 252, a video frequency selector 254, and an outer loop oscillator 255. The outer loop oscillator 255 includes a numerically controlled oscillator 256 and a sine/cosine lookup table 258. The outer loop oscillator 255 drives the quadrature multiplier 215.

The inner feedback loop includes the loop low pass filter 219 that taps the output of the video filter and decimator block 217, the loop complex mixer 221, the rectangular-to-polar converter (RPC) 230, the sine look up table 235, an inner loop filter 240, and an inner loop oscillator 245. The loop low pass filter removes high frequency video content from the baseband signal. The inner loop oscillator 245, like the outer loop oscillator 255, includes a numerically controlled oscillator 242 and a sine/cosine lookup table 244. The inner feedback loop drives both the video complex mixer 220, and the loop complex mixer 221.

As can be seen, both the outer and inner feedback loops share the loop low pass filter 219, the loop complex mixer 221, the RPC 230 and the sine lookup table 235. The RPC 230 receives the filtered and mixed digital IF signal from the loop low pass filter 219 and the loop complex mixer 221 and isolates phase information from amplitude information in the digital IF signal. The inner and outer loop oscillators, 245 and 255, use the phase information to tune the video complex mixer 220 and the quadrature multiplier 215, respectively.

The amplitude information is isolated as feedback for the AGC circuit 210. The RPC can use a rectangular-to-polar conversion algorithm such as CORDIC, or the RPC can be a lookup table. One skilled in the art could envision of various means for affecting the rectangular-to-polar conversion based on the discussion given herein.

The audio recovery circuit 290 includes an audio delay block 280, an audio complex mixer 282, an audio filter and decimator block 284, an AGC circuit 286, an FM demodulator 288, and an audio low pass filter 289. Audio complex mixer 282 receives input from the video recovery circuit. The feed back path includes an audio zero order hold circuit 270 coupled to an output of the inner loop filter 240, an audio frequency selector 272, and an audio oscillator circuit 275. The audio oscillator circuit 275 includes a numerically controlled oscillator 274, and a sine/cosine look up table 276. The audio oscillator 275 drives the audio complex mixer 282.

The PGA 204, the A/D converter 108, and the AGC circuit 210 form an AGC loop circuit that is configured to use the full dynamic range of the A/D converter 108. The PGA 204 receives the analog IF input signal 107 and variably amplifies the analog input signal 107 according to an automatic gain control (AGC) circuit 210, which receives feedback in the form of amplitude information (R) from RPC 230. The A/D converter 108 receives the output of the PGA 204 and digitizes the output of the PGA 204 to generate a digital IF signal 205. The digital IF signal 205 is multiplied by an output from the AGC circuit 210 by multiplier 206. The A/D converter 108 is configured to sample the output of the PGA 204 so as to down-convert the output of the PGA 204 to second, and lower, IF signal. In one embodiment, the A/D converter 108 is configured to sub-sample the output of the PGA 204 so as the effect the down-conversion.

Quadrature multiplier 215 includes two multipliers arranged parallel fashion. The two multipliers are configured to accept a signal and mix it with an in-phase (I) signal and a quadrature (Q) signal from a local oscillator to generate an IQ output signal. Complex Mixers 220, 221, and 282 are full complex multipliers; each accepts two complex signals and produces one complex output.

The primary function of the quadrature multiplier 215 is to accomplish a gross down-conversion to baseband, and to center the down-converted IF signal on the video filter and decimator block 217 at the front end of the video recovery circuit 260. This ensures full use of the dynamic range of the filters therein. Quadrature multiplier 215 is driven by feedback from the outer loop, which is designed, to track and correct gross frequency errors in the video recovery circuit 260.

It is important that the video baseband signal remain properly centered on the Nyquist filter for effective Nyquist shaping. This centering is the primary function of the inner feedback loop, which is designed to track fast phase perturbations occurring in the digital IF signal. The inner loop filter 240 sets the bandwidth of the inner feedback loop. Inner loop filter 240 has a much higher bandwidth than the outer loop filter 252, making the inner loop faster and providing the ability to track fast phase perturbations. However, over time, gross frequency errors could accumulate in the inner feedback loop. Therefore, the inner loop filter 240 is designed with a defective integrator, via a defective pole. The defective pole prevents gross frequency errors from accumulating by allowing the integrator contents to leak to the outer feedback loop, where they are collected and fed back to the quadrature multiplier 215 at the front end of the video recovery circuit. As with the outer loop filter 252, the bandwidth of the inner loop filter is typically determined empirically based on the specific application.

The center frequency of the outer loop oscillator 255 is programmed according to the location of the tuner output. This value is inserted into the circuitry by adder 254. In this way, different IF frequency plans can be supported.

The front end of the video recovery circuit includes a video filter and decimator circuit 217, which selects the video component from the baseband signal. The video delay circuit 218 compensates for delay introduced in the loop low pass filter 219.

The inner loop oscillator 245 provides an in-phase and quadrature output to drive both the video complex mixer 220 and the loop complex mixer 221, which is shared with the outer feedback loop. The frequency of the inner loop oscillator 245 is determined by the bandwidth of the inner loop filter 240 as discussed above.

The video complex mixer 220 then mixes the filtered baseband digital IF signal with the output of the inner loop oscillator 245 to further down-convert the digital IF signal to produce an I and Q video baseband output. The I and Q video baseband signals from the video complex mixer 220 are then sent to the Nyquist filter 260. The Nyquist filter 260 combines the I and Q outputs from the video complex mixer 220 and performs Nyquist shaping that was traditionally done by the SAW filter at the IF frequency. The group delay filter 262 provides for group delay compensations of the video baseband signal. The audio trap filter 264 removes the audio carrier from the video baseband signal, leaving only a video signal that is thereafter interpolated by interpolator 268, to produce a digital video signal 113. The order of the group delay filter 262 and the audio trap filter 264 can be reversed.

The audio recovery circuit performs audio signal recovery. Audio delay circuit 280 compensates for the delay introduced in the blocks 217 and 219. The audio complex mixer 282 receives the baseband output of the parallel multiplier 215 and further down-converts the audio component of the digital IF signal to an audio baseband signal. The audio baseband signal is then filtered and decimated by audio filter and decimator block 284 to remove unwanted signals, including the video signal. The FM demodulator 288 receives the complex audio baseband signal and demodulates it to produce digital audio output signal 250 that can be, for example, BTSC compatible. The audio complex mixer 282 is driven in quadrature by input from the video recovery circuit 260.

For NTSC, the audio carrier is offset from the picture carrier by 4.5 MHz. Other frequency offsets could be possible depending on the standard used. For example, the audio carrier could be offset by 5.5 MHz, 6.0 MHz, and/or 6.5 MHz, or by some other amount. Audio frequency selector 272, which is included in the input from the video recovery circuit 260, allows the specific standard to be selected.

The various filters (e.g. Nyquist filter 260) in the digital IF demodulator 110 are digital filters that can be implemented using fixed coefficients or programmable coefficients. For example, the filters can be implemented with digital signal processors, which add flexibility to design of the demodulator.

FIG. 3 further illustrates the frequency spectrum of a 6 MHz TV channel 300. The TV channel 300 has a picture carrier 302 at DC (or 0 Hz), and a sound carrier 304 that is offset from the picture carrier 302 by 4.5 MHz. Further details of the TV channel 300 are also included including the picture signal envelope having an upper sideband 306 and a vestigal sideband 308. The I signal 310, Q signal 312, and the color carrier 314 are also shown for completeness.

FIG. 4 further describes the operation of the IF demodulator 110 using method 400. An analog IF signal is received having a video component and an audio component. The analog IF signal can be a TV signal or channel that is down-converted by a TV tuner, such as the tuner 102, or another type of RF signal. An exemplary TV channel is shown in FIG. 3. In step 402, the analog IF signal is digitized to create a digital IF signal that has a video component and an audio component.

In step 404, an outer loop oscillator signal is generated so that it can be used for down-conversion of the digital IF signal. For example, outer loop oscillator 225 generates an in-phase signal and a quadrature oscillator signal for the parallel mixer 220. The frequency of the outer loop oscillator 225 is configured to correct gross frequency errors that accumulate in the video recovery circuit 260 due to the design of the inner feedback loop. As noted above, the outer feedback loop is designed to collect frequencies that bleed from the inner loop filter 240 because of the inner loop filter's defective pole. This prevents the accumulation of gross frequency errors as the faster inner feedback loop tracks fast phase perturbations. The bandwidth of the outer loop filter 252 is typically determined empirically, based on the specific application, and is much lower than that of the inner loop filter 240.

In step 406, the digital IF signal is down-converted to baseband using the quadrature multiplier 215 driven by the outer loop oscillator signal 255. The down-converted signal has a video component and an audio component. In step 408, the down-converted digital IF signal is filtered and decimated to remove unwanted signals, such as the audio component of the digital IF signal.

In step 410, an inner loop oscillator signal is generated having an in-phase component and a quadrature component. The inner loop oscillator signal is configured to correct fast phase perturbations in the digital IF signal and to center the digital IF signal on the Nyquist filter 260. The bandwidth of the inner loop oscillator signal is determined by the inner loop filter 240. The inner loop 240 has a higher bandwidth than the outer loop 252, and is designed with a defective integrator, via causing a defective pole. The defective pole allows the integrator contents to leak from the inner feedback loop to the outer feedback loop, thereby preventing the accumulation of gross frequency errors within the inner loop. In step 412, the digital IF signal is further down converted to a video baseband signal using a video complex mixer 220 that is driven by the inner loop oscillator 245.

FIG. 4B fully illustrates recovery of a digital video signal from the video baseband signal, which is the desired output of the video recovery circuit. In step 416, Nyquist shaping is performed on the video baseband signal. One skilled in the art would recognize other possibilities for signal recovery based on the discussion given herein. According to step 418, a group delay filter 262 compensates for group delay introduced by the transmitter. The remaining audio component in the digital IF signal is removed by the audio trap filter 264 according to step 420. Finally, in step 422, the video baseband signal is interpolated to produce a digital video output signal 113.

FIG. 5 further describes the operation of the audio recovery circuit 290 of IF demodulator 110. As illustrated in FIGS. 2 and 4, the audio recovery circuit 290 receives the down-converted digital IF signal from the output of quadrature multiplier 215. In step 502, an audio oscillator signal is generated based on the frequency offset between the video and audio components of the digital IF signal. For example, for NTSC, the audio oscillator 275 can generate an in-phase and a quadrature oscillator signal having relatively fixed frequencies of 4.5 MHz. Audio frequency selector 272 allows different audio frequency standards to be implemented.

In step 504, the audio component of the digital IF signal is down-converted to audio baseband using the audio complex mixer 282 driven by the audio oscillator 275. In step 506, the audio baseband signal is filtered and decimated to remove unwanted signals, such as the video component of the digital IF signal. In step 508, the audio baseband signal is demodulated using FM demodulator 288. Finally, in step 510, the demodulated audio baseband signal is passed through an audio low pass filter 289 to produce a digital audio signal.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A digital IF demodulator, including:
    means for converting an analog IF signal to a digital IF signal;
    means for down-converting said digital IF signal to a baseband signal having a video component and an audio component, said means for down-converting including means for correcting gross frequency errors in said digital IF signal;
    means for selecting said video component from said baseband signal; and
    means for down-converting said video component to a video baseband signal, including a means for correcting fast phase perturbations in said digital IF signal.

2. The digital IF demodulator of claim 1, further comprising:
    means for down-converting said audio component to an audio baseband signal.

3. The digital IF demodulator of claim 1, wherein said means for correcting a gross frequency error, includes:
    means for generating an outer loop oscillator signal based on feedback from said video baseband signal, so as to center a down-converted digital IF signal in a video filter of said means for selecting said video component.

4. The digital IF demodulator of claim 1, wherein said means for correcting fast phase perturbations in said digital IF signal, includes:
    means for generating an inner loop oscillator signal based on feedback from said video baseband signal, so as to center said video baseband signal in the passband of a corresponding output filter.

5. The digital IF demodulator of claim 4, wherein said means for generating said outer loop oscillator signal is based on said inner loop oscillator signal.

6. The digital IF demodulator of claim 4, wherein said means for generating an inner loop oscillator signal is more responsive to changes in said video baseband signal than said means for generating said outer loop oscillator signal.

7. The digital IF demodulator of claim 4, wherein said means for generating an inner loop oscillator signal has a defective filter pole so that accumulated gross frequency offsets leak to said means for generating an outer loop oscillator.

8. The digital IF demodulator of claim 4, wherein at least one of said means for generating an outer loop oscillator signal and said means for generating an inner loop oscillator signal include a sine/cosine look-up table coupled to an output of a numerically controlled oscillator.

9. The digital IF demodulator of claim 1, further comprising:
means for variably amplifying said analog IF signal, responsive to an amplitude of said video baseband signal.

10. The digital IF demodulator of claim 9, wherein a gain of said means for amplifying is determined to use a full dynamic range of said means for converting.

11. The digital IF demodulator of claim 1, wherein said digital IF demodulator is at least partially disposed on a silicon substrate, according to a Complementary Metal Oxide Semiconductor (CMOS) process.

12. The digital IF demodulator of claim 1, wherein said audio component of said digital IF signal includes an audio carrier that is offset in frequency from a picture carrier in said video component of said digital IF signal.

13. The digital IF demodulator of claim 12, wherein said audio carrier is offset from said picture carrier by approximately 4.5 MHz.

14. The digital IF demodulator of claim 12, wherein said audio carrier is offset from said picture carrier by approximately 5.5 MHz.

15. The digital IF demodulator of claim 12, wherein said audio carrier is offset from said picture carrier by approximately 6.0 MHz.

16. The digital IF demodulator of claim 12, wherein said audio carrier is offset from said picture carrier by approximately 5.0 MHz.

17. The digital IF demodulator of claim 1, wherein said means for correcting gross frequency errors includes a first feedback loop for correcting gross frequency errors in said digital IF signal.

18. The digital IF demodulator of claim 17, wherein said means for correcting fast phase perturbations includes a second feedback loop for correcting fast phase perturbations in said digital IF signal, wherein said second feedback loop is different from said first feedback loop.

* * * * *